(12) United States Patent
Wang et al.

(10) Patent No.: US 9,520,414 B2
(45) Date of Patent: Dec. 13, 2016

(54) THIN FILM TRANSISTOR ARRAY SUBSTRATE AND METHOD FOR MANUFACTURING THE SAME

(71) Applicant: Shenzhen China Star Optoelectronics Technology Co., Ltd., Shenzhen, Guangdong (CN)

(72) Inventors: Cong Wang, Guangdong (CN); Ming-Hung Shih, Guangdong (CN); Peng Du, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 39 days.

(21) Appl. No.: 14/370,774

(22) PCT Filed: Jun. 18, 2014

(86) PCT No.: PCT/CN2014/080244
§ 371 (c)(1),
(2) Date: Jul. 5, 2014

(87) PCT Pub. No.: WO2015/188394
PCT Pub. Date: Dec. 17, 2015

(65) Prior Publication Data
US 2015/0372010 A1    Dec. 24, 2015

(30) Foreign Application Priority Data
Jun. 12, 2014  (CN) .......................... 2014 1 0262232

(51) Int. Cl.
*H01L 27/12* (2006.01)
*H01L 27/32* (2006.01)
(Continued)

(52) U.S. Cl.
CPC .......... *H01L 27/124* (2013.01); *G02F 1/1362* (2013.01); *H01L 27/1259* (2013.01);
(Continued)

(58) Field of Classification Search
CPC ............... H01L 27/124; H01L 27/1259; H01L 27/3276; H01L 27/3262; H01L 29/786; H01L 27/1214; H01L 27/3258; H01L 21/768; G02F 1/1362
(Continued)

(56) References Cited

U.S. PATENT DOCUMENTS

2004/0135939 A1* 7/2004 Luo ................... G02F 1/136209
349/110
2013/0161604 A1* 6/2013 Huang ................ G02F 1/13458
257/43

FOREIGN PATENT DOCUMENTS

CN         101625493 A      1/2010

* cited by examiner

Primary Examiner — Caleen Sullivan
(74) Attorney, Agent, or Firm — Andrew C. Cheng

(57) ABSTRACT

The present invention proposes a TFT array substrate includes: a substrate; scan lines on the substrate; data lines intercrossing with the scan lines; a first insulating layer between the scan lines and the data lines; a second insulating layer on the first insulating layer and covering the data lines; a common electrode layer on the second insulating layer, comprising first holes located above the data lines. The first holes uncover the second insulating layer. The present invention decreases parasitic capacitance between the common electrode layer and data lines and between the common electrode layer and scan lines by decreasing overlaping sections between a common electrode layer and the data lines and between the common electrode layer and the scan lines. Therefore load of the data lines and the scan lines
(Continued)

decreases, charge efficiency of the pixels increases, and display effect of an LCD panel is therefore improved.

8 Claims, 2 Drawing Sheets

(51) Int. Cl.
*G02F 1/1362* (2006.01)
*H01L 21/768* (2006.01)

(52) U.S. Cl.
CPC ...... *H01L 27/1214* (2013.01); *H01L 27/3258* (2013.01); *H01L 27/3262* (2013.01); *H01L 27/3276* (2013.01)

(58) Field of Classification Search
USPC .......................................................... 257/773
See application file for complete search history.

THIN FILM TRANSISTOR ARRAY SUBSTRATE AND METHOD FOR MANUFACTURING THE SAME

BACK GROUND OF THE INVENTION

1. Field of the Invention

The present invention relates to a manufacturing field of display device, more particularly, to a thin film transistor (TFT) array substrate and a method for manufacturing the same.

2. Description of the Prior Art

Generally, a liquid crystal display (LCD) panel comprises a TFT array substrate, a color filter substrate, and a liquid crystal layer in between the TFT array substrate and the color filter substrate. By exerting voltage on the TFT array substrate and the color filter substrate respectively, whether light penetrates or not depends on controlling twist of liquid crystal molecule, in order to fulfill the object of display.

In a conventional LCD panel with in plane switching (IPS) wide-angle display model or fring field switching (FFS) display model, the TFT array substrate comprises a transparent substrate, a common electrode layer set up on the transparent substrate, scan lines set up on the common electrode layer, data lines intercross with the scan lines, pixel electrodes set up on the data lines, and a insulating layer set up between the common electrode layer and the scan lines, between the scan lines and the data lines, between data lines and the pixel electrodes. However, in practice, electric interference exists between the data lines and the pixel electrodes and between the scan lines and the pixel electrodes, which interferes in-plane twist of liquid crystal molecules in the liquid crystal layer, thus interferes display effect of the LCD panel.

To improve this disadvantage, the present invention provides a new design of the TFT array substrate. More particularly, the TFT array substrate comprises a transparent substrate, scan lines formed on the transparent substrate, data lines formed on and cross set with the scan lines, a common electrode layer set up on the data lines, pixel electrodes set up on the common electrode layer, and an insulating layer set up between the scan lines and the data lines, between the data lines and the common electrode layer, between the common electrode layer and the pixel electrodes. In that way, electric interference between the data lines and the pixel electrodes and between the scan lines and the pixel electrodes is effectively shielded. However, in practice, overlaping sections of the common electrode layer and the data lines as well as the common electrode layer and the scan lines generates parasitic capacitance, resulting in load increase of the scan lines and the data lines, leading to decrease of pixels' charge efficiency, thus worsens display effect of the LCD panel.

SUMMARY OF THE INVENTION

To solve the problems existing in the prior art, the present invention proposes a thin film transistor (TFT) array substrate comprises: a substrate; scan lines on the substrate; data lines intercrossing with the scan lines; a first insulating layer between the scan lines and the data lines; a second insulating layer on the first insulating layer and covering the data lines; a common electrode layer on the second insulating layer, comprising a plurality of first holes located above the data lines, wherein the plurality of first holes uncover the second insulating layer.

Furthermore, the common electrode layer comprises a plurality of second holes located above the scan lines, and the plurality of second holes uncover the second insulating layer.

Furthermore, each first hole is shaped as a tangular, and a width of each first hole is the same as a width of the data line.

Furthermore, the plurality of first holes locate right above of the data lines.

Furthermore, each second hole is shaped as a tangular, and a width of each second hole is the same as a width of the scan line.

Furthermore, the plurality of second holes locate right above the scan lines.

The present invention also proposes a method for manufacturing a TFT array substrate, comprises: depositing scan lines on the substrate; depositing a first insulating layer, covering the scan lines, on the substrate; forming data lines, intercrossing with the scan lines, on the first insulating layer; forming the second insulating layer, covering the data lines, on the first insulating layer; forming a common electrode layer on the second insulating layer; forming a plurality of first holes locating above the data lines on the common electrode layer, and the plurality of first holes uncovering the second insulating layer.

Furthermore, the method further comprises: forming a plurality of second holes locating above the scan lines, and the plurality of second holes uncovering the second insulating layer.

Furthermore, the plurality of first holes locate right above of the data lines.

Furthermore, the plurality of second holes locate right above the scan lines.

Furthermore, each first hole is shaped as a tangular, and a width of each first hole is the same as a width of the data line.

Furthermore, each second hole is shaped as a tangular, and a width of each second hole is the same as a width of the scan line.

The present invention provides a thin film transistor (TFT) array substrate and a manufacturing method thereof, which shields electric interference generated in between data lines and pixel electrodes and in between scan lines and pixel electrodes; in the meanwhile, by decreasing overlaping sections between a common electrode layer and the data lines and between the common electrode layer and the scan lines, decreases parasitic capacitance between the common electrode layer and data lines and between the common electrode layer and scan lines; thus load of the data lines and the scan lines decreases, charge efficiency of the pixels increases, and display effect of an LCD panel is therefore improved.

BRIEF DESCRIPTION OF THE DRAWINGS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

DETAILED DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

In order to illustrate the technique and effects of the present invention, a detailed description will be disclosed by the following disclosure in conjunction with figures. It is noted that the same components are labeled by the same number. The terms "first", "second" or "third", as used herein, are defined as different components.

Figure 1:
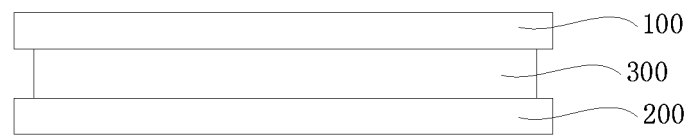
FIG. 1 is a side view of a liquid crystal display panel according to a preferred embodiment of the present invention.
Figure 2:
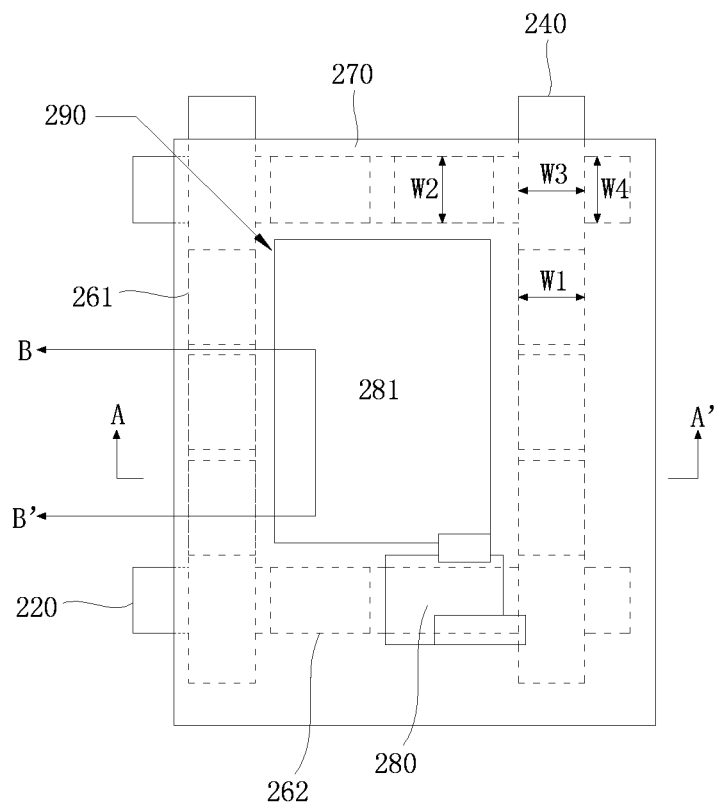
FIG. 2 is a partial view of a thin film transistor array substrate according to the preferred embodiment of the present invention.
Figure 3:
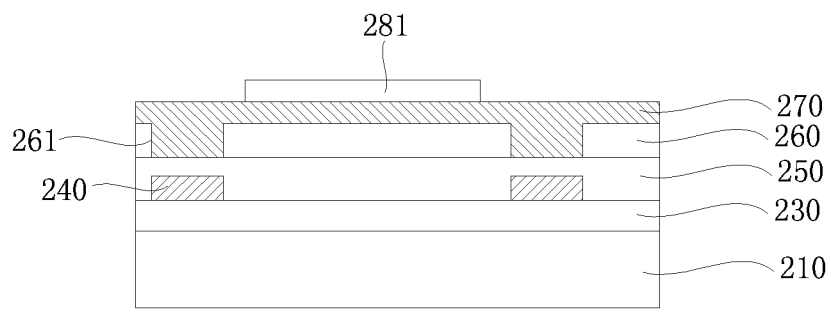
FIG. 3 is a cross-sectional view of the TFT array substrate along a line A-A' shown in FIG. 2.
Figure 4:
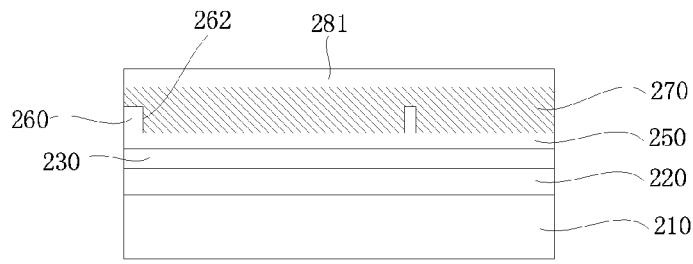
FIG. 4 is a cross-sectional view of the TFT array substrate along a line B-B' shown in FIG. 2.

FIG. 1 is a side view of a liquid crystal display (LCD) panel according to a preferred embodiment of the present invention. FIG. 2 is a partial view of a thin film transistor (TFT) array substrate according to the preferred embodiment of the present invention. FIG. 3 is a cross-sectional view of the TFT array substrate along a line A-A' shown in FIG. 2. FIG. 4 is a cross-sectional view of the TFT array substrate along a line B-B' shown in FIG. 2.

Please refer to FIGS. 1-4. The TFT array substrate according to the preferred embodiment of the present invention comprises a color filter substrate 100, a TFT array substrate 200, and a liquid crystal layer 300 set between the color filter substrate and the TFT array substrate 200.

The liquid crystal layer 300 comprises a plurality of liquid crystal molecules. The color filter (CF) substrate 100 set up in opposition to the TFT array substrate 200 comprises substrates (such as transparent glass substrate) and a black matrix on the substrates, a color photoresist layer (such as red (R), green (G) and blue (B) light filter patterns) and an alignment layer. As the CF substrate 100 of the present invention is identical with CF substrates of conventional LCD panels, please refer its concrete structure to relating conventional arts.

The TFT array substrate 200 comprises a substrate 210, a plurality of scan lines 220, a first insulating layer 230, a plurality of data lines 240, a second insulating layer 250, a common electrode layer 260, a third insulating layer 270 and a plurality of TFTs 280.

The substrate 210 is but not limited to a transparent glass substrate (as in the embodiment). The plurality of scan lines 220 are set up on the substrate 210. The first insulating layer 230 is set up on the substrate 210 and covers every scan line 220. The plurality of data lines 240 is set up on the first insulating layer 230 and cross set with the plurality of scan lines 220. In other words, the first insulating layer 230 is set up in between the plurality of scan lines 220 and the plurality of data lines 240, and locates in between the substrate 210 and the plurality of data lines 240.

In the present invention, the first insulating layer 230 is only set where every scan line 220 and every data line 240 cross and overlap. In other words, the first insulating layer 230 is not set where every scan line 220 and every data line 240 do not cross, neither set on the substrate 210. As an alternative, in the present invention, the first insulating layer 230 is only set on every scan line 220, not the the substrate 210.

The second insulating layer 230 is set up on the first insulating layer 230 and covers the plurality of data lines 240. The common electrode layer 260 is made of transparent conductive material, such as indium tin oxide (ITO). The common electrode layer 260 is set up on the second insulating layer 250 and comprises a plurality of first holes 261. Every first hole 260 uncovers the second insulating layer 250 and locates over every corresponding data line 240. Preferably, in the embodiment, every first hole 260 locates right above every corresponding data line 240. Preferably, the shape of the first hole 261 can be a tangular, whose width W1 is the same as the width W3 of the data line 240. The tangular's width W1 can also be smaller or larger than the width W3 of the data line 240. Moreover, in the present invention, the shape of the first hole 261 is not limited to a tangular; it can also be other suitable shapes, i.e. regular shapes such as a circular or a triangle, or irregular shapes.

In addition, the common electrode layer 260 also comprises a plurality of second holes 262. Every second hole 262 uncovers the second insulating layer 250 and locates above every corresponding scan line 220. Preferably, in the embodiment, every second hole 262 locates right above every corresponding scan line 220.

Preferably, the shape of the second hole 262 can be a tangular, whose width W2 is the same as the width W4 of the scan line 220. Understandably, the tangular's width W2 can also be smaller or larger than the width W4 of the scan line 220. Moreover, in the present invention, the shape of the second hole 262 is not limited to a tangular; it can also be other suitable shapes, i.e. regular shapes such as a circular or a triangle, or irregular shapes.

A third insulating layer 270 is set up on the common electrode layer 260 and fills every first hole 261 and every second hole 262. Every two neighboring scan lines 220 and every two neighboring data lines 240 rounds up a zone defined as a pixel zone 290. Every TFT 280 is correspondingly set up in the zones where every scan line 220 and every data line 240 intercross. The main function of the TFT 280 is to provide driving voltage of liquid crystal molecules in the liquid crystal layer 300, to deviate liquid crystal molecule, so that lights penetrate the liquid crystal layer 300, and form image on the LCD panel with the aid of the color filter substrate 100. Pixel electrodes 281 of every TFT 280 are set up on the third insulating layer 270 and locares above corresponding pixel zones 290. The pixel electrodes 281 can be made of transparent conductive materials, such as ITO material.

In addition, in the embodiment, the first insulating layer 230, the second insulating layer 250 and the third insulating layer 270 can be made of identical insulating materials, such as silicon nitride.

Figure 5:
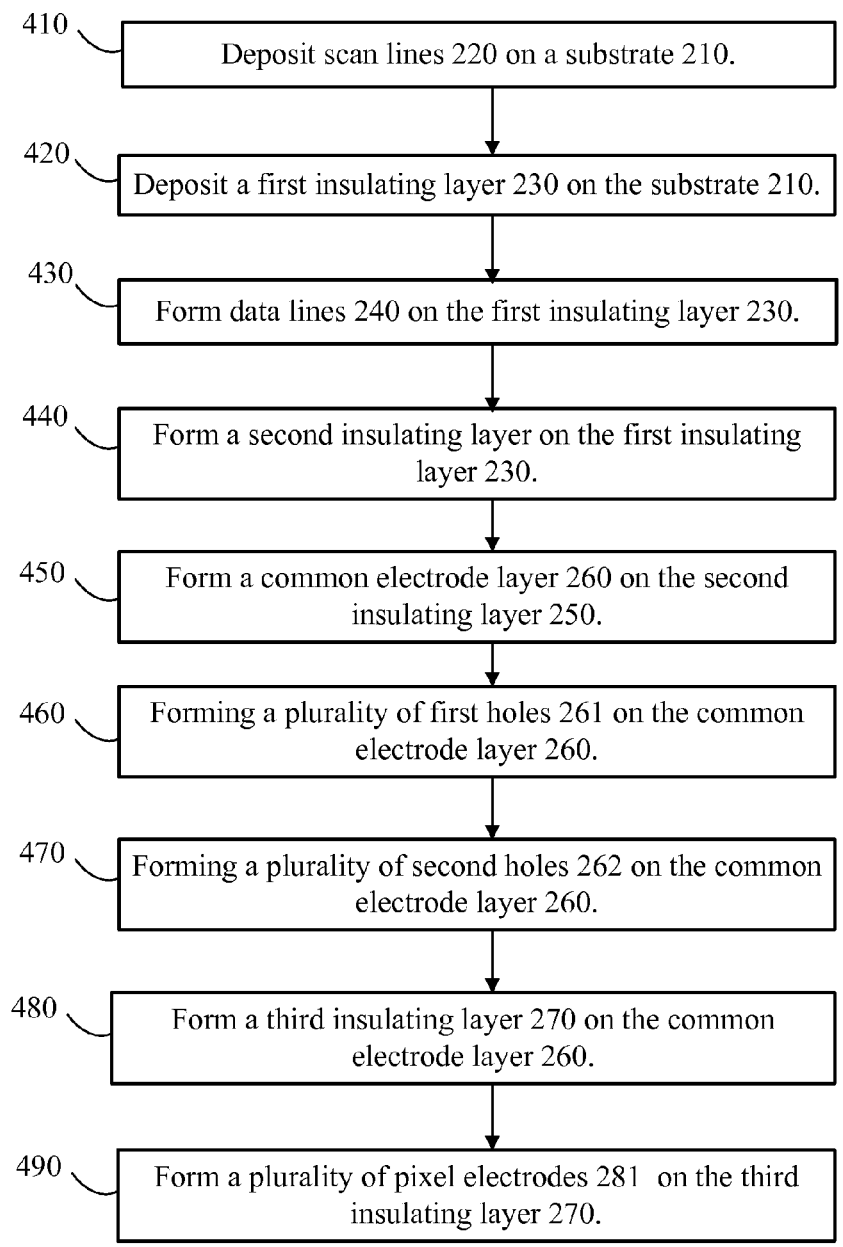
FIG. 5 is a flowchart of a method of manufacturing the TFT array substrate according to another embodiment of the present invention.

FIG. 5 is a flowchart of a method of manufacturing the TFT array substrate according to another embodiment of the present invention.

Please refer to FIG. 2 to FIG. 5. In step 410, a plurality of scan lines 220 are deposited upon the substrate 210. The substrate 210 can be but not limited to a transparent glass substrate as in the embodiment. The scan line 220 can be made of metal materials, such as one of Cr, Ti, Al, Mo, Cu, Nd or alloy of any of the above metals.

In step 420, a first insulating layer 230 deposits on the substrate 210, and the first insulating layer 230 covers a plurality of scan lines 220. The first insulating layer 230 can be made of insulating materials such as silicon nitride.

In step 430, a plurality of data lines 240 deposit on the first insulating layer 230, and every data line 240 cross set with every scan line 220. The data line 240 can be made of metal materials, such as one of Cr, Ti, Al, Mo, Cu, Nd or alloy of any of the above metals. Moreover, the region enclosed by every two neighboring scan lines 220 and every two neighboring data lines 240 is defined as the pixel zone 290.

Naturally, in the present invention, the first insulating layer 230 can only form where every scan line 220 and every data line 240 cross and overlap. In that way, the first insulating layer 230 is not set up where every scan line 220 and every data line 240 do not cross, neither on the substrate 210. Or, in the present invention, the first insulating 230 is only set up on every scan line 220, not on the substrate 210.

In step 440, the second insulating layer 250 deposits on the first insulating layer 230 and covers a plurality of data lines 240. The first insulating layer 230 can be made of insulating materials such as silicon nitride.

In step 450, the common electrode layer 260 deposits on the second insulating layer 250. The common electrode layer 260 can be made of transparent conductive materials, such as Indium Tin oxide (ITO).

In step 460, a plurality of first holes 261 form in the common electrode layer 260. Every first hole 261 discloses the second insulating layer 250 and locates above every corresponding data line 240. Preferably, in the embodiment, every first hole 261 locates right above every corresponding data line 240. Preferably, the shape of the first hole 261 can be a tangular, whose width W1 is the same as the width W3 of the data line 240. The tangular's width W1 can also be smaller or larger than the width W3 of the data line 240. Moreover, in the present invention, the shape of the first hole 261 is not limited to a tangular; it can also be other suitable shapes, i.e. regular shapes such as a circular or a triangle, or irregular shapes.

In step 470, a plurality of second holes 262 form in the common electrode layer 260. Every first hole 262 discloses the second insulating layer 250 and locates above every corresponding scan line 220. Preferably, in the embodiment, every second hole 262 locates right above every corresponding scan line 220. Preferably, the shape of the second hole 262 can be a tangular, whose width W2 is the same as the width W4 of the scan line 220. The tangular's width W2 can also be smaller or larger than the width W4 of the scan line 220. Moreover, in the present invention, the shape of the first hole 262 is not limited to a tangular; it can also be other suitable shapes, i.e. regular shapes such as a circular or a triangle, or irregular shapes.

In addition, in the present invention, praction sequence of step 460 and step 470 can be replaced with each other or undergo simultaneously.

In step 480, the third insulating layer 270 deposits on the common electrode layer 260, and fills every first hole 261 and second hole 262. The third insulating layer 270 can be made of insulating materials such as silicon nitride.

In step 490, a plurality of pixel electrodes 281 deposit on the third insulating layer 270. Every pixel electrode 281 locates above the corresponding pixel zone 290. The pixel electrode 281 can be made of transparent conductive material, such as ITO.

In sum, the TFT array substrate and the manufacturing method thereof in the embodiment of the present invention shield electric interference between every data line 240 and the pixel electrode 281 and electric interference between every scan line 220 and the pixel electrode 281, in the mean while decrease overlapping area of the common electrode 260 and every data line 240 and overlapping area of the common electrode 260 and every scan line 220, so that parasitic capacitance between the common electrode layer 260 and every data line 240 and parasitic capacitance between the common electrode layer 260 and every scan line 220 decrease; as a result, load of every data line 240 and every scan line 220 is bring down, charge efficiency of pixels is raised up, and display effect of the LCD panel is improved.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A thin film transistor (TFT) array substrate comprising:
a substrate;
scan lines on the substrate;
data lines intercrossing with the scan lines;
a first insulating layer between the scan lines and the data lines;
a second insulating layer on the first insulating layer and covering the data lines;
a common electrode layer on the second insulating layer, comprising a plurality of first holes located above the data lines, wherein the plurality of first holes uncover the second insulating layer,
wherein the first insulating layer is only set where the scan line and the data line overlaps.

2. The TFT array substrate of claim 1, wherein the common electrode layer comprises a plurality of second holes located above the scan lines, and the plurality of second holes uncover the second insulating layer.

3. The TFT array substrate of claim 1, wherein each first hole is shaped as a tangular, and a width of each first hole is the same as a width of the data line.

4. The TFT array substrate of claim 1, wherein the plurality of first holes locate right above of the data lines.

5. The TFT array substrate of claim 3, wherein the plurality of first holes locate right above of the data lines.

6. The TFT array substrate of claim 2, wherein each second hole is shaped as a tangular, and a width of each second hole is the same as a width of the scan line.

7. The TFT array substrate of claim 2, wherein the plurality of second holes locate right above the scan lines.

8. The TFT array substrate of claim 6, wherein the plurality of second holes locate right above the scan lines.

* * * * *